(12) United States Patent
Tanaka et al.

(10) Patent No.: US 9,819,147 B2
(45) Date of Patent: Nov. 14, 2017

(54) METHOD TO TUNE EMISSION WAVELENGTH OF WAVELENGTH TUNABLE LASER APPARATUS AND LASER APPARATUS

(71) Applicant: Sumitomo Electric Device Innovations, Inc., Yokohama-shi (JP)

(72) Inventors: Hirokazu Tanaka, Yokohama (JP); Tetsufumi Odagawa, Yokohama (JP); Hiromitsu Kawamura, Yokohama (JP); Masao Shibata, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 14/830,585

(22) Filed: Aug. 19, 2015

(65) Prior Publication Data

US 2016/0056604 A1 Feb. 25, 2016

(30) Foreign Application Priority Data

Aug. 21, 2014 (JP) .................. 2014-168747

(51) Int. Cl.
*H01S 5/0687* (2006.01)
*H01S 5/0625* (2006.01)
*H01S 5/026* (2006.01)
*H01S 5/0683* (2006.01)

(52) U.S. Cl.
CPC ........ *H01S 5/06256* (2013.01); *H01S 5/0687* (2013.01); *H01S 5/06258* (2013.01); *H01S 5/0265* (2013.01); *H01S 5/0683* (2013.01)

(58) Field of Classification Search
CPC ............................ H01S 5/0265; H01S 5/0687
See application file for complete search history.

(56) References Cited

U.S. PATENT DOCUMENTS

| 2006/0109873 A1* | 5/2006 | Crosson | H01S 5/141 372/19 |
| 2013/0070795 A1* | 3/2013 | Ikagawa | H01S 5/06256 372/20 |

FOREIGN PATENT DOCUMENTS

JP 2014-045172 A 3/2014

* cited by examiner

*Primary Examiner* — Tod T Van Roy
(74) *Attorney, Agent, or Firm* — Venable LLP; Michael A. Sartori; Laura G. Remus

(57) ABSTRACT

A method to tune an emission wavelength of a wavelength tunable laser apparatus is disclosed. The laser apparatus implements, in addition to a wavelength tunable laser diode (t-LD) integrating with a semiconductor optical amplifier (SOA), a wavelength monitor including an etalon filter. The current emission wavelength is determined by a ratio of the magnitude of a filtered beam passing the etalon filter to a raw beam not passing the etalon filter. The method first sets the SOA in an absorbing mode to sense stray component disturbing the wavelength monitor, then correct the ratio of the beams by subtracting the contribution from the stray component.

2 Claims, 8 Drawing Sheets

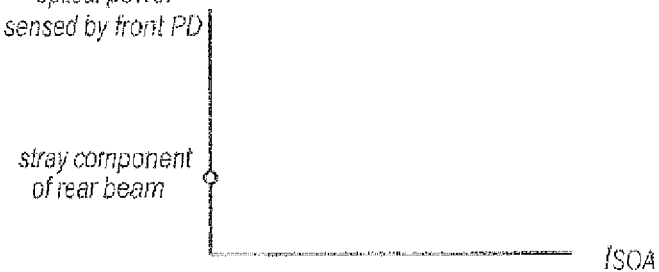
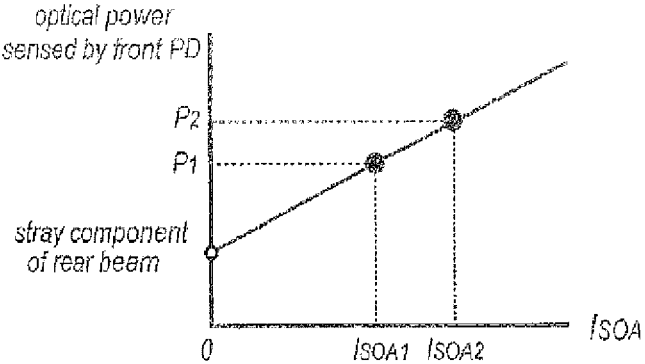
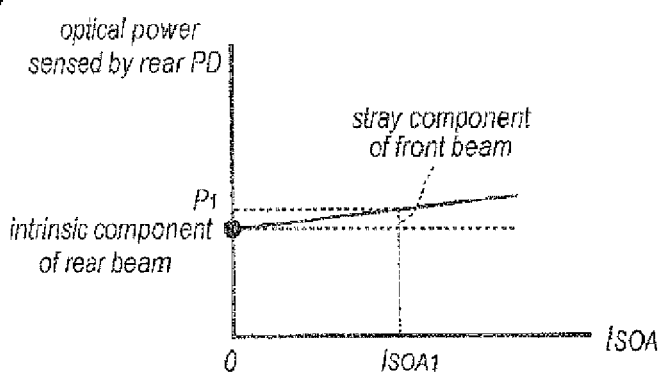

METHOD TO TUNE EMISSION WAVELENGTH OF WAVELENGTH TUNABLE LASER APPARATUS AND LASER APPARATUS

BACKGROUND OF THE INVENTION

1. Field of the Invention

The present application relates to a laser system, in particular, relates to a wavelength tunable laser system.

2. Background Art

A laser module that implements a wavelength tunable laser diode (t-LD) accompanies with a wavelength detector, or a wavelength locker to tune an emission wavelength of the t-LD. A t-LD often accompanies with a semiconductor optical amplifier (SOA) to amplify light generated in an LD having a wavelength tunable function, because the light output from the LD with the wavelength tunable function is often limited in output power thereof. The SOA is usually integrated with the LD with the wavelength tunable function.

The wavelength detector, or the wavelength locker, implements an optical component inherently showing a specific transmittance, typically an etalon filter. Detecting a magnitude of raw light not passing the etalon filter and that of filtered light passing through the etalon filter, and comparing a ratio of the magnitude of the filtered light to that of the raw light with the transmittance of the etalon filter, the wavelength of the raw light, namely, the wavelength of the light currently emitted from the LD may be estimated. The wavelength tunable module may tune the emission wavelength thereof so as to coincide the current emission wavelength thus estimated with the target wavelength.

Recent optical communication systems request five or more figures in the preciseness of the signal wavelength. An optical module implementing a t-LD therein applicable to such communication system inevitably implements the superior exactness of the emission wavelength by a compact arrangement and simplified procedures.

SUMMARY OF THE INVENTION

An aspect of the present application relates to e method to tune an emission wavelength of a laser apparatus, where the laser apparatus includes (a) a wavelength tunable laser diode (t-LD) that integrates a laser diode (LD) with a semiconductor optical amplifier (SOA), and (b) a wavelength monitor that senses the emission wavelength of the t-LD. In the laser apparatus of the present application, the wavelength monitor is disposed in one of a front side and a rear side of the t-LD, and includes an optical filter, a first photodiode (PD) that senses a raw beam, which is not transmitted through the optical filter, and a second PD that senses a filtered beam, which is split from the raw beam and transmitted through the optical filter. The method of the present application comprises steps of: (1) evaluating a first stray component and a second stray component by a first PD and a second PD, respectively, where the first stray component and the second stray component originate to an optical beam output from another of the front side and the rear side not disposing the wavelength monitor; (2) sensing the raw beam and the filtered beam by the first PD and the second PD, respectively; and (3) calculating a ratio of the filtered beam subtracted with the second stray component to the raw beam subtracted with the first stray component.

Another aspect of the present application relates to a laser apparatus that comprises (a) a wavelength tunable laser diode (t-LD) that integrates a semiconductor laser diode (LD) with a semiconductor optical amplifier (SOA), where the t-LD emits an optical beam through the SOA from a facet thereof and another optical beam from another facet opposite to the facet; (b) a wavelength monitor that includes an optical filter, a first photodiode (PD), which senses a raw beam not transmitting through the optical filter, a second PD, which senses a filtered beam spilt from the raw beam and transmitting through the optical filter, where the raw beam and the filtered beam originate to one of the optical beam and the another optical beam; and (c) a controller that calculates a ratio of the filtered beam subtracted with a second stray component to the raw beam subtracted with a first stray component. In the laser apparatus, the first stray component and the second stray component are not originated to the wavelength monitor.

BRIEF DESCRIPTION OF THE DRAWINGS

The invention may be more completely understood in consideration of the following detailed description of various embodiments of the invention in connection with the accompanying drawings, in which:

FIG. 6A shows a mechanism to remove the contribution of the stray component according to the first embodiment, FIG. 6B shows a mechanism to remove the contribution of the stray component according to the second embodiment, and FIG. 6C shows a mechanism to remove the contribution of the stray component in the third embodiment;

DESCRIPTION OF EMBODIMENTS

Next, some embodiments according to the present application will be described as referring to drawings. In the description of the drawings, numerals or symbols same with or similar to each other will refer to elements same with or similar to each other without duplicated explanations.

(First Embodiment)

Figure 1:
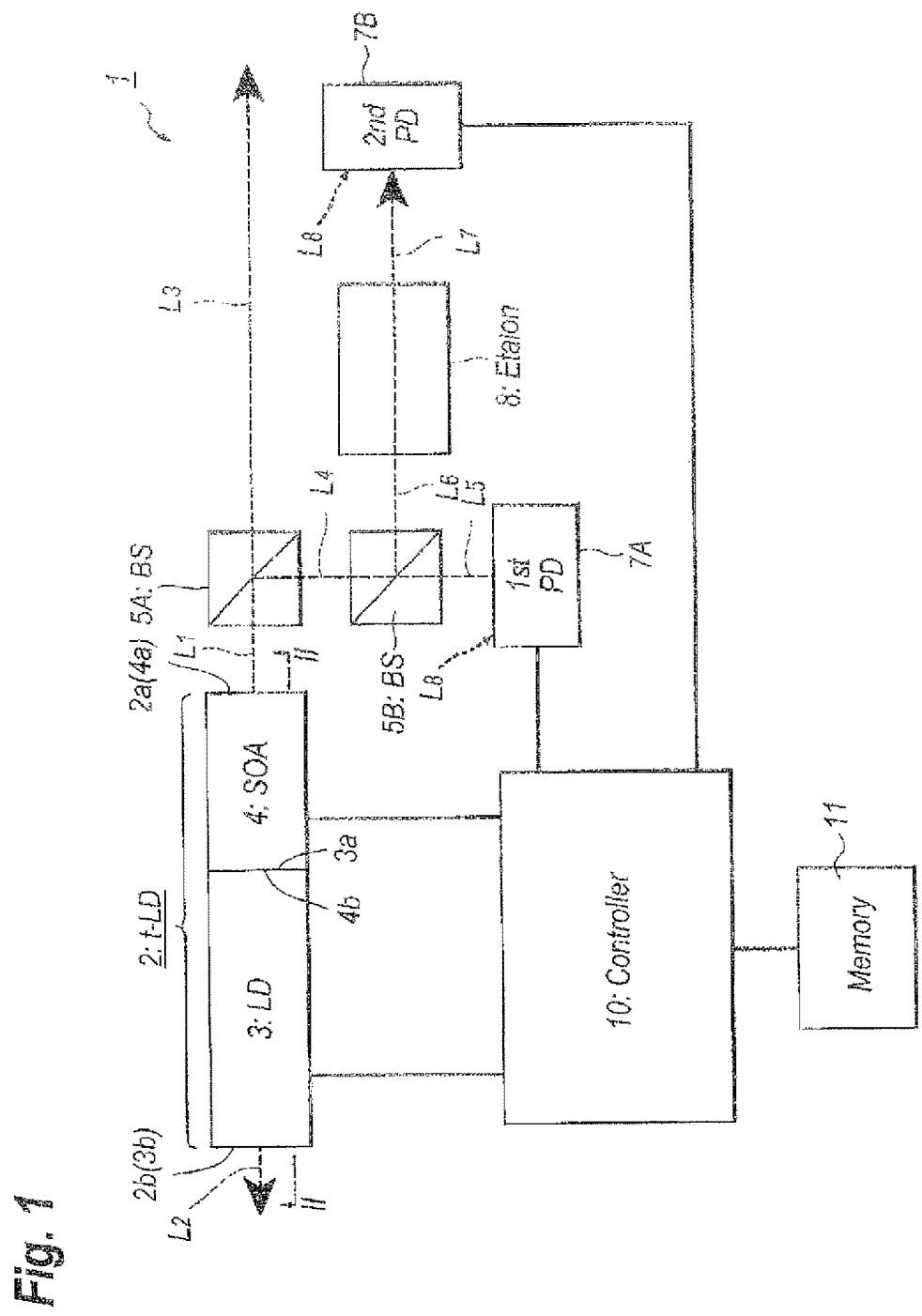
FIG. 1 is a functional block diagram of a laser apparatus according to the first embodiment of the present application.

FIG. 1 schematically illustrates a functional block diagram of a wavelength tunable system (hereafter simply denoted as laser system) 1 according to the first embodiment of the present application. The laser system 1 includes a light-generating device 2 integrating a laser diode (hereafter simply denoted as LD) 3 with a semiconductor optical amplifier (hereafter simply denoted as SOA) 4, optical splitters (hereafter simply denoted as first and second BSs), 5A and 5B, a first optical detector 7A, an etalon filter 8, a second optical detector 7B, and a controller 10 integrating with a memory 11. The LD 3 is served as a wavelength tunable semiconductor laser diode, and thus the light-generating device 2 is also served as a wavelength tunable semiconductor laser diode. Therefore, the light-generating device is simply denoted as t-LD hereafter.

Figure 2:
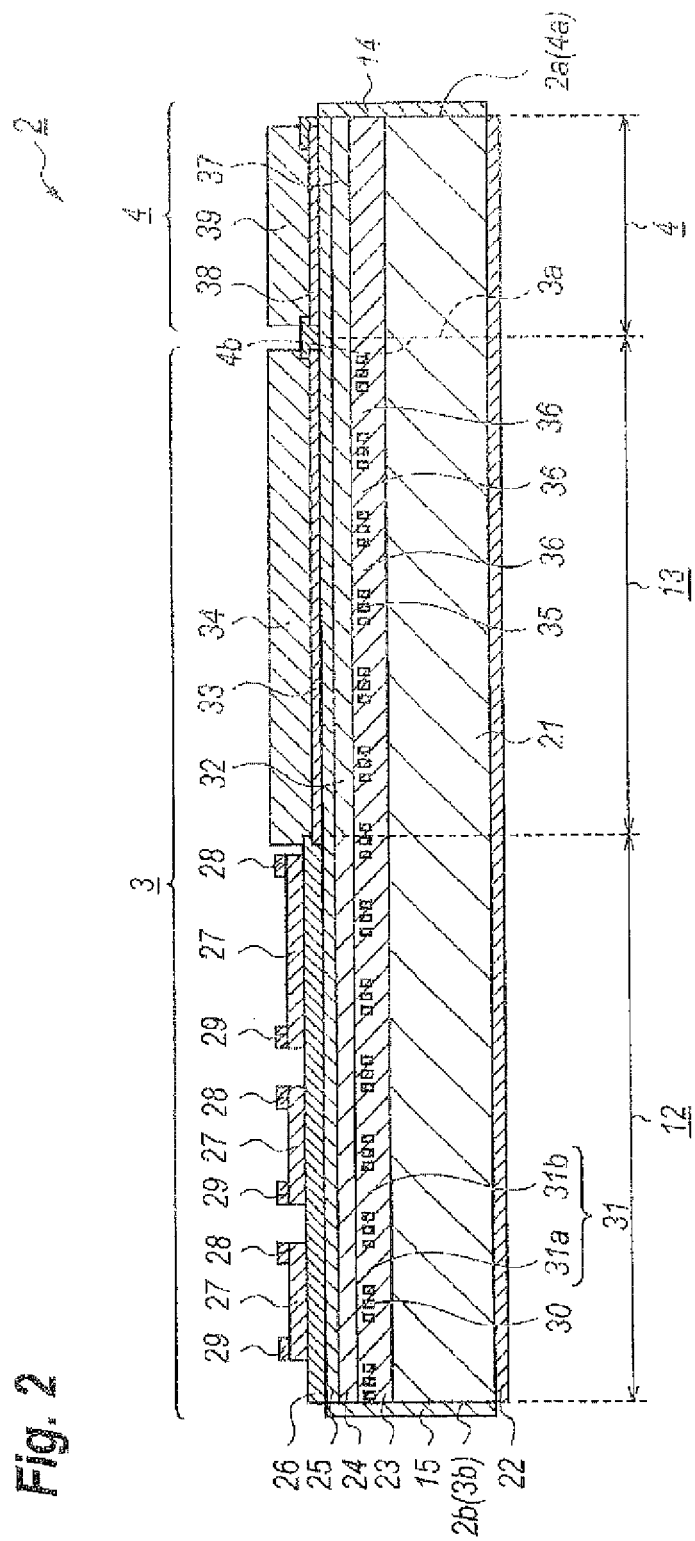
FIG. 2 is a cross section of the wavelength tunable LD implemented with the laser apparatus shown in FIG. 1, which is taken along the line II-II indicated in FIG. 1.

FIG. 2 shows a cross section of the t-LD 2 taken along the line II-II indicated in FIG. 1. As described, the t-LD 2 monolithically integrates the LD 3 with the SOA 4 on a semiconductor substrate 21. The semiconductor substrate 21 may be made of InP and provides a back electrode 22 in a whole surface thereof. The back electrode 22 is common to the LD3 and the SOA 4.

The LD 3 emits light attributed to a wavelength thereof tuned by the controller 10. The LD 3 comprises a CSG-DBR (Chirped Sampled Grating Distributed Reflector) region 12 and SG-DFB (Sampled Grating Distributed Feedback) region 13, where the latter region is next to the SOA 4. That is, the SG-DFB region 13 is disposed between the SOA 4 and the CSG-BR region 12 along the optical axis of the device 2. The SG-DFB region 13 provides in a side opposite to the CSG-DBR region 12 a facet 3a which optically couples with the SOA 4, while, the CSG-DBR region 12 provides in a side opposite to the SG-DFB region 13 another facet 3b.

The CSG-DBR region 12, which is inherently attributed to a reflection spectrum including a plurality of peaks with a constant span, may include a lower cladding layer 23 made of InP, a waveguide layer 24 having a quantum well formed by InGaAsP and so on, an upper cladding layer 25 made of InP, an insulating film 26 including oxide (SiOx), and a plurality of heaters 27. The waveguide layer 24 is unnecessary to show an optical gain. The heaters 27, which accompany with respective electrodes, 28 and 29, may adjust temperature of the waveguide layer 24 along the optical axis, which means that the reflection spectrum attributed to the CSG-DBR region 12, in particular, the wavelength of respective reflection peaks may be varied. Accordingly, a reflection band width may be widened and the emission wavelength of the LD 3 may be continuously varied.

The lower cladding layer 23 intermittently includes a plurality of gratings 30 with spaces 31 therebetween, but lengths of the spaces 31 are not uniform. A space 31a has a length different from lengths of other spaces 31b. Such gratings 30 and spaces 31 are called as the chirped sampled grating and show a convex envelope of the reflection peaks.

The SG-DFB region 13 is inherently attributed with an optical gain spectrum having a plurality of optical gain peaks. The LD 3 may emit light with the emission wavelength at which one of the reflection peaks of the CSG-DFB region 12 coincides with one of the gain peaks of the SG-DFB region 13. The SG-DFB region 13 includes the lower cladding layer 23, which is common to the lower cladding layer 23 in the CSG-DBR region 12, an active layer 32 having a quantum well structure including InGaAsP and so on, an upper cladding layer 25, which is also common to the upper cladding layer 25 of the CSG-DBR region 12, a contact layer 33, and an electrode 34. Injecting carriers into the active layer 32 from the electrode 34, the SG-DFB region 13 shows the optical gain greater than unity for causing the laser oscillation in the LD 3.

The lower cladding layer 23 of the SG-DFB region 13 also provides a plurality of gratings 35 with spaces 36 therebetween. Different from the CSG-DBR region 12, the spaces 36 of the SG-DFB region 13 have a length common to all spaces 36. For instance, the spaces 36 in the SG-DFB region 13 may be equal to the length of the space 31 $b$ in the CSG-DBR region 12. The gratings in the CSG-DBR region 12 and those in the SG-DEB region 13 have a pitch between corrugation same with others.

The SOA 4 includes a lower cladding layer 23, an active layer 37 with a quantum well structure made of InGaAsP and so on, an upper cladding layer 25, a contact layer 38 made of InGaAsP and so on, and an electrode 39. Injecting carriers into the active layer 37 through the electrode 39, the SOA 4 may show a function of amplifying light entering therein from the SG-DFB region 13. Adjusting the bias applied to the SOA 4, the SOA 4 shows a function of absorbing light to vanish the optical power output therefrom. Two facets, 4a and 4b, exactly the facet 4b is an interface against the SG-DFB region 13, face to each other along the optical axis of the t-LD 2.

Two facets, 2a and 2b, of the t-LD 2 provide antireflection (AR) films 14 and 15, which show the reflectivity less than 1%.

According the facets, 2a and 2b, may emit light, $L_1$ and $L_2$, as shown in FIG. 1. The former light $L_1$, which is amplified in the SOA 4, becomes the output light of the laser system 1. On the other hand, the other light $L_2$ has intensity far less than that of the front light $L_1$ because no SOAs are provided between the CSG-DBR region 12 and the facet 2b.

Referring back to FIG. 1, the first BS 5A splits the optical beam $L_1$ coming from the t-LD 2 into two beams, $L_3$ and $L_4$. The former beam $L_3$ is output external from, the laser apparatus 1, while, the latter beam $L_4$ enters the second BS 5B. The second BS 5B also splits the entering beam $L_4$ into two beams, $L_5$ and $L_6$, where the former beam $L_5$ enters, or is sensed by the first optical detector 7A, and the latter beam is sensed by the second optical detector 7B after passing the etalon filter 8. Because the first and second BSs, 5A and 5B, have the transmittance and the reflectance substantially independent of wavelengths subject to the t-LD 2 and no functions to convert a wavelength of light, the beam $L_5$ sensed by the first optical detector 7A has the wavelength independent magnitude and the wavelength thereof is same as the beam $L_3$ just output from-the t-LD 2.

The first and second optical detectors, 7A and 7B, may be typically photodiodes (PD). The first PD 7A as described above, receives the optical beam $L_5$ spilt by the second BS 5B but not passing the etalon filter 8, while, the second PD 7B receives the optical beam $L_7$ passing the etalon filter 8. The etalon filter 8 is an optical filter having a specific transmittance strongly depending on the wavelength of light passing therethrough. Thus, the optical system including the first and second PDs, 7A and 7B, and the etalon filter may determine the wavelength of the light just output from the t-LD 2, because the ratio of outputs of the first and second PDs, 7A and 7B, equivalently gives the transmittance of the etalon filter 8. Comparing thus evaluated ratio with the transmittance of the etalon filter 8, which is inherently given by the specification thereof, the wavelength of the optical beam $L_7$ just passing the etalon filter 8, corresponds to the emission wavelength of the t-LD 2. Accordingly, the optical system including the optical filter 8, and the first and second PDs, 7A and 7B, is often called as a wavelength monitor, or, as a wavelength locker because the emission wavelength of the t-LD 2 may be locked at a desired wavelength based on the monitored wavelength.

The first and second PD, 7A and 7B, may also sense other light except for the optical beams, $L_5$ and $L_7$, respectively. That is, the laser apparatus 1 causes an optical beam $L_2$ output from the rear facet 2b of the t-LD 2, and those output derived from the optical beams, $L_1$, and $L_3$ to $L_7$, but reflected at somewhere toward the first and second PDs, 7A and 7B, which are called as stray component $L_8$. The existence of the stray component $L_8$ affects the evaluation of the ratio of the first and second PDs, 7A and 7B. Resultantly, the wavelength determined by the ratio becomes incorrect, and the laser apparatus 1 outputs the optical beam with an erroneous wavelength.

The controller 10 may be, for instance, a micro-controller including a central processing unit (CPU) to set the SOA 4 in an absorbing mode or in an amplifying mode by supplying a bias current to the SOA 4. When no bias current is supplied to the SOA 4, the SOA 4 becomes the absorbing mode. On the other hand, the SOA is set in the amplifying mode when the substantial bias is supplied.

Also, the controller 10 tunes the wavelength of the optical beam $L_1$ output from the t-LD 2. As described, the outputs of the first and second PDs, 7A and 7B, are provided to the controller 10 to evaluate the ratio thereof. In addition, the controller 10 may evaluate the stray components $L_8$ also detected by the first and second PDs, 7A and 7B. Specifically, the controller 10 sets the SOA 4 in the absorbing mode, which means substantially no optical beam $L_1$ is output horn the t-LD 2, but the optical beam $L_2$ output from the rear facet $2b$ of the t-LD 2 is still left, which possibly becomes the stray component $L_8$; then, the controller 10 may evaluate the stray components through the outputs of the first and second PDs, 7A and 7B. Details of the evaluation of the stray component $L_8$ will be described later.

The controller 10 may tune the emission wavelength of the t-LD 2 comparing thus determined wavelength of the optical beam $L_1$ currently output from the t-LD 2 with the target wavelength. Based on a difference between the current emission wavelength and the target wavelength, the controller 10 may adjust powers supplied to the heaters 27 and biases to the SG-DFB region 13 so as to coincide the current wavelength with the target wavelength. The memory 11 may store the magnitudes of the stray component $L_8$ detected by the first and second PDs, 7A and 7B, where these magnitudes are correction values to calculate the ratio of the outputs of the first and second PDs, 7A and 7B.

Figure 3:
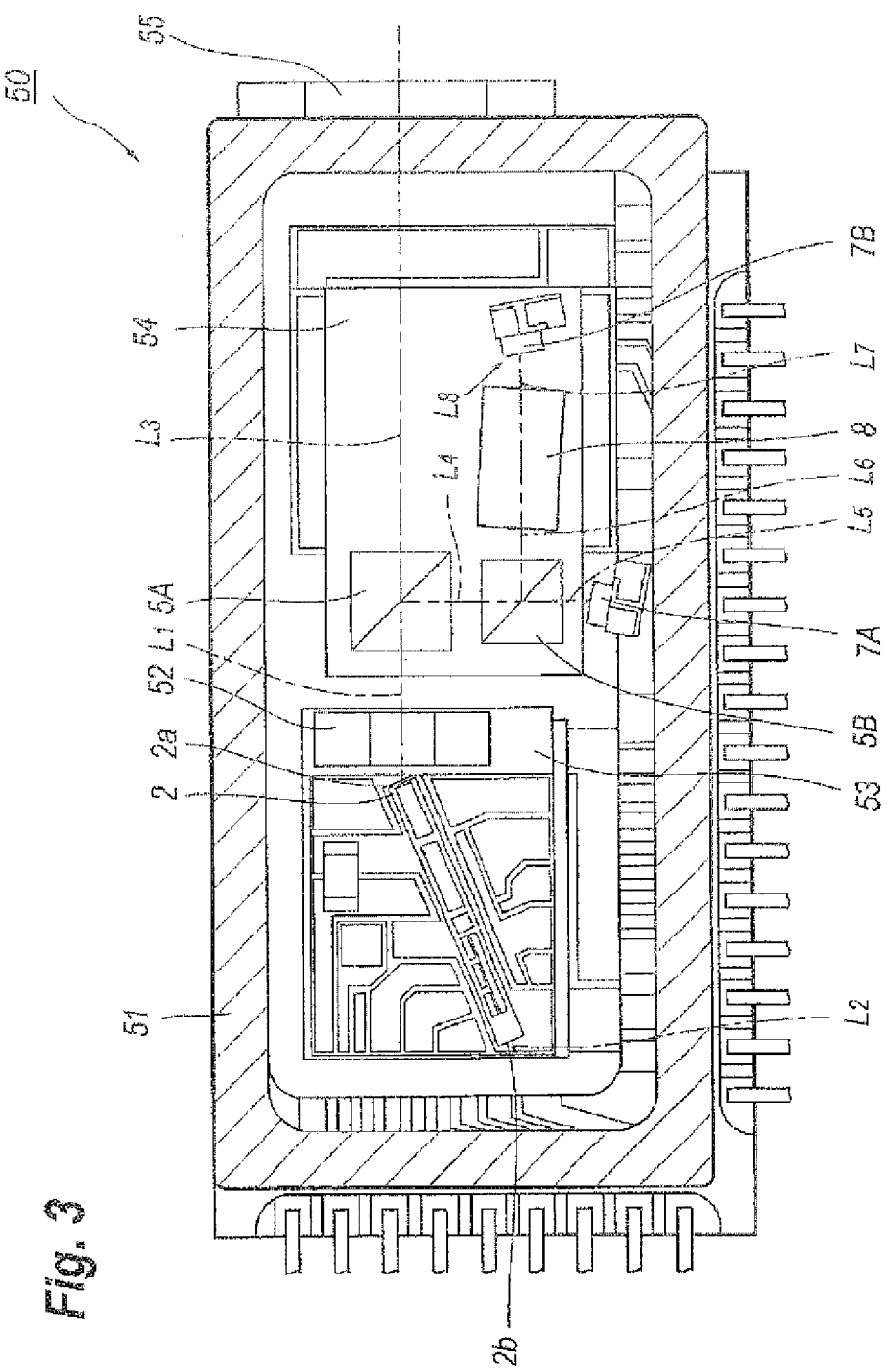
FIG. 3 is a plan view of a laser module implementing the laser apparatus shown in FIG. 1.

FIG. 3 is a plan view showing a laser module 50 implementing the laser apparatus 1 thus described. As illustrated in FIG. 3, the laser module 50 provides a housing 51 into which the laser apparatus 1 is installed. The laser apparatus 1 provides a collimating lens 52 between the t-LD 2 and the first BS 5A, which collimates the optical beam $L_1$ output from the front facet $2a$ of the t-LD 2. The t-LD 2 and the collimating lens 52 are set on a thermos-electric cooler (TEC) 53 to stabilize the emission wavelength of the t-LD 2. The optical beam $L_1$ entering the first BS 5A is processed according to the optical system described in FIG. 1 and output from the window 55 of the housing 51 as the former beam $L_3$. The optical system, namely, the first and second BSs, 5A and 5B, the etalon filter 8, and the second PD 7B are mounted on another TEC 54 that stabilizes a temperature of optical components mounted thereon, in particular, that of the etalon filter 8. Two sides of the housing 51 provide lead pins to supply powers to respective TECs 53 and 54, and to respective heaters 27 of the t-LD 2, and provide biases to the t-LD 2.

As described in FIG. 1, the optical beam $L_2$ output from the rear facet of the t-LD 2 possibly becomes a stray component $L_8$ and may be respectively sensed by the first and second PDs, 7A and 7B, after reflected at somewhere within the housing 51. The magnitudes of the stray component $L_8$ at the first and second PDs, 7A and 7B, are indeterminable or uncontrollable. Surface conditions of the optical components, those of the inner wall of the housing 51, relative positions between the components, and so on all affects the magnitude of the stray component. Accordingly, the magnitude of the stray component is necessary to be sensed in respective laser modules.

Figure 4:
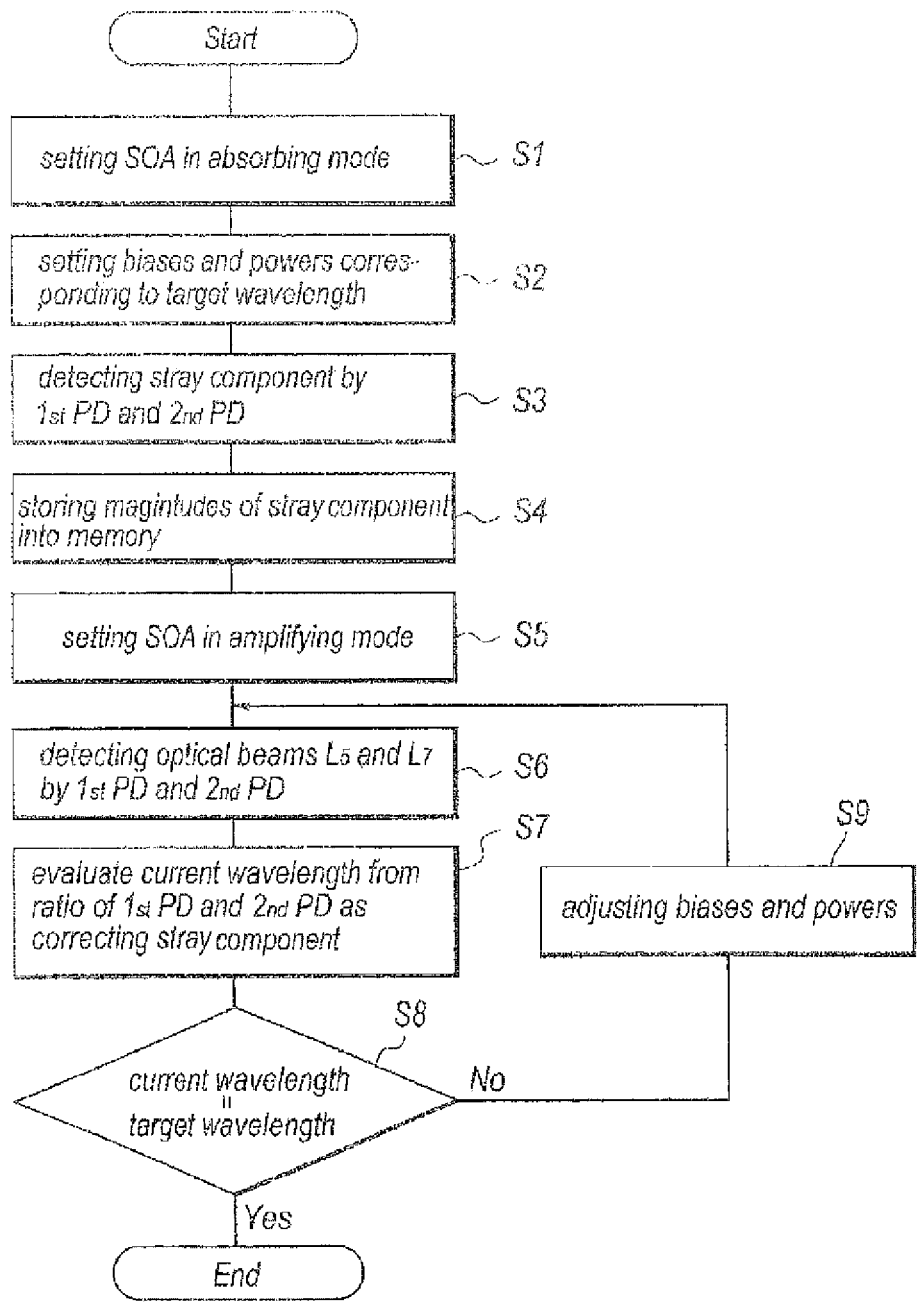
FIG. 4 is a flowchart to estimate the current emission wavelength of a t-LD implemented within the laser apparatus of FIG. 1.

Next, one of procedures, or algorithms to tune the emission wavelength of the laser module 50 will be described as referring to FIGS. 4 and 5. FIG. 4 shows a flow chart to tune the emission wavelength of the laser module 50 according to the first embodiment of the present application, where the tuning of the emission wavelength in the target or closely around the target wavelength is carried out as ceasing the optical output externally, which is often called as the dark tuning.

First, the process sets the SOA 4 in the absorbing mode by providing a negative bias (the negative bias includes no bias) thereto, at step S1, which forces the output power of the front beam $L_1$ to be substantially zero, or at least far less than the power of the rear beam $L_2$. Then, the biases and powers corresponding to the target wavelength are provided to the LD 3, and the temperature of the t-LD 2 is set constant in the one corresponding to the target wavelength, at step S2. The t-LD 2 may emit light by being provided with the biases and powers, but the front beam to be output from the front facet $2a$ is substantially absorbed in the SOA 4. Only the rear beam $L_2$ is practically output from the rear facet $2b$ of the t-LD 2. The first and second PDs, 7A and 7B, detect the stray component $L_8$ originated to the rear beam $L_2$, at step S3. FIG. 6A shows the stray component $L_8$ at step S3. The outputs of the first and second PDs, 7A and 7B, are not usually equal to each other reflecting the physical positions thereof and the surface conditions of optical components. The magnitudes of the stray component $L_8$ thus detected are stored within the memory 11 as correction values, at step S4.

Then, the SOA 4 is set in the amplifying mode by providing a positive bias thereto at step S5. The t-LD 2 outputs the front beam $L_1$ in addition to the rear beam $L_2$. The first and second PDs, 7A and 7B, sense the raw beam $L_5$ not passing the etalon filter 8 and the filtered beam $L_7$ passing through the etalon filter 8, respectively. The controller 10 receives thus detected magnitudes of the raw beam $L_5$ and the filtered beam $L_7$, at step S6. The controller 10 estimates the current emission wavelength taking the stored magnitude of the stray component $L_8$ and the magnitudes of the raw beam $L_1$ and the filtered beam $L_7$ into account, at step S7.

Figure 5:
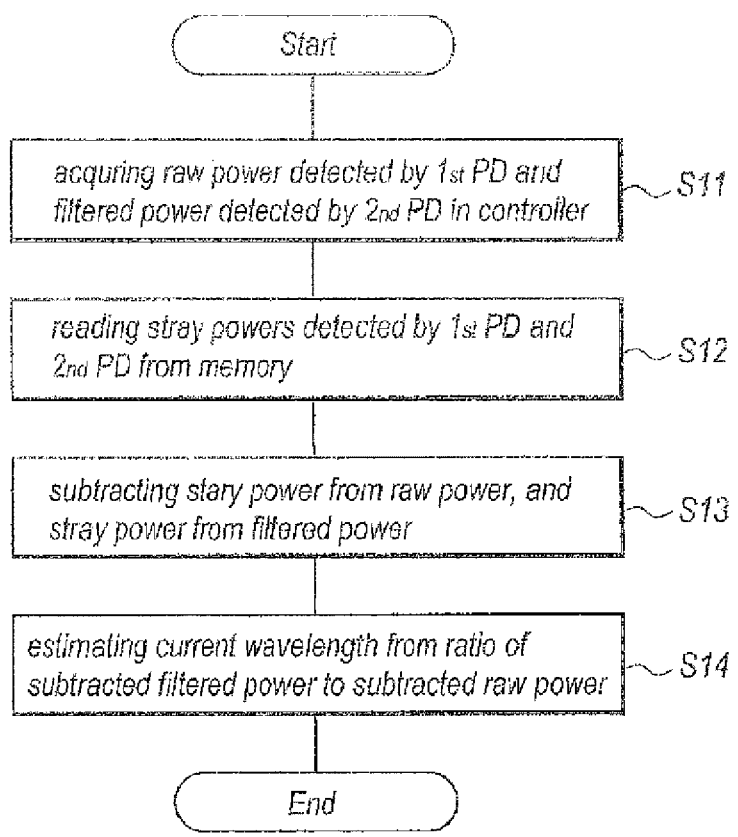
FIG. 5 is a flowchart to estimate the current emission wavelength taken the factor of the stray component into accounts.

The estimation of the current emission wavelength obeys the flowchart shown in FIG. 5. First, the controller 10 acquires the magnitude of the raw beam $L_5$ from the first PD 7A, and that of the filtered beam $L_7$ from the second PD 7B, at step S11. Then the controller 10 fetches the magnitudes of the stray component $L_8$ from the memory 11, at step S12. The controller 10 subtracts the magnitude of the stray component $L_8$ detected by the first PD 7A from that of the raw beam $L_5$, and that of another stray component $L_8$ detected by the second PD 7B from the magnitude of the filtered beam $L_7$, at step S13. Thus, two magnitudes of the stray component $L_8$ have a role of the correction factors for the raw beam $L_5$ and the filtered beam $L_7$. Finally, the controller 10 estimates the current emission wavelength by a ratio of the corrected magnitude of the filtered beam $L_7$ to the corrected magnitude of the raw beam $L_5$. Assuming that the magnitude of the stray component $L_8$ detected by the first PD 7A, that by the second PD 7B, that of the raw beam $L_5$, and that of the filtered beam $L_7$, are D1, D2, D3, and D4, respectively, the controller 10 may estimate the current emission wavelength by the ratio of (D4−D2)/(D3−D1).

Referring back to FIG. 4, the controller 10 compares the current emission wavelength thus estimated with the target wavelength at step S8. When the current emission wavelength is out of a preset range around the target wavelength, which responds to "No" in step S8, the controller 10 adjusts the biases and powers supplied to the LD 3 so as to set the current emission wavelength closer to the target wavelength, at step S9. Iterating the steps S6 to S9, the current emission wavelength enters the preset range around the target wavelength, that is, the current emission wavelength substantially coincides with the target wavelength.

A convectional laser apparatus does not correct the factor of the stray component in the estimation of the current emission wavelength from the ratio of the magnitudes of two PDs. Accordingly, the estimated emission wavelength does not exactly reflect the current emission wavelength. On the other hand, the laser apparatus 1 or the laser module 50 of the present application can eliminate the factor of the stray component in the estimation of the current emission wavelength. The magnitude of the raw beam $L_5$ and that of the filtered beam $L_7$ are subtracted with the magnitudes of respective stray component, which are taken in advance to the estimation of the emission wavelength. Thus, the laser apparatus 1, or the laser module 50, may enhance the accuracy of the estimation of the current emission wavelength, which resultantly increases the exactness of the coincidence the current emission wavelength with the target wavelength.

The magnitudes of the stray component $L_8$ originating to the rear beam $L_2$ may be detected under a state where the SOA 4 is set in the absorbing mode, and biases and powers are provided to LD 3 to practically activate the LD 3, namely, the rear beam $L_2$ is practically output from the rear facet 2b. Although the description above first sets the SOA 4 in the absorbing mode and then provides the biases and powers to the LD 2; the order of these two procedures is unconcerned.

The evaluation of the magnitude of the stray component $L_8$ is necessary to be carried out before that practical tune of the emission wavelength, but the laser module 50 is unnecessary to evaluate the power of the stray component $L_8$ in every tunes. When the evaluation of the stray component is performed during the delivery inspection of the laser module 50 and the magnitudes of the stray component $L_8$ sensed by the first and second PDs, 7A and 7B, are stored in the memory 11, the controller 10 may read those magnitudes from the memory 11 and calculate the accurate wavelength currently emitted from the t-LD 2 during every tuning, which may shorten the time to converge the current emission wavelength on the target wavelength.

(Second Embodiment)

The algorithm to estimate the current emission wavelength described above that detects the magnitude of the stray component $L_8$ by setting the SOA 4 in the absorbing mode. That is, only the rear beam $L_2$ is output from the LD 2 and the first and second PDs, 7A and 7B, sense the stray component $L_8$ originated to the rear beam $L_2$. However, the rear beam $L_2$ is generally less than the front beam $L_1$ even when the SOA 4 is set in the amplifying mode. Moreover, the stray component is somehow detected by the first and second PDs, 7A and 7B, after being reflected somewhere several times, and thus the magnitude of the stray component becomes faint and strongly affected by noises. When the controller 10 processes the magnitude of the detected beam digitally, the analog-to-digital conversion of the stray component $L_8$ is affected by the quantizing error.

The algorithm according to the second embodiment avoids such disadvantages described above and has a feature that the stray component in the magnitude thereof is indirectly sensed. Specifically, refining to FIG. 6B, the SOA 4 is set in the amplifying mode by providing the bias currents in two levels, $I_{SOA1}$ and $I_{SOA2}$, different from each other. The first and second PDs 7A and 7B, respectively sense the raw beam $L_5$ and the filtered beam $L_7$ for respective levels. The magnitude of the stray component (or namely the magnitude when no front beam L1 being output) can be obtained by extrapolating a plotted line connecting two sensed magnitudes for corresponding bias currents to a point showing the state of having no bias current. Because the magnitudes, $P_1$ and $P_2$, of the front beam $L_1$ are substantial, the first and second PDs, 7A and 7B, may generate respective outputs with substantial intensities alleviating the influence from noises and the quantization error when the intensities are processed digitally.

Three or more levels of the bias current are preferable to enhance the accuracy of the magnitude of the stray component. Moreover, the levels of the bias current may be selected in a region where the SOA 4 shows a linear dependence in the optical gain thereof against the bias current. An SOA inherently saturates the optical gain thereof in a relatively larger bias current. Thus, the levels of the bias current may be set in a moderate range.

(Third Embodiment)

Figure 7:
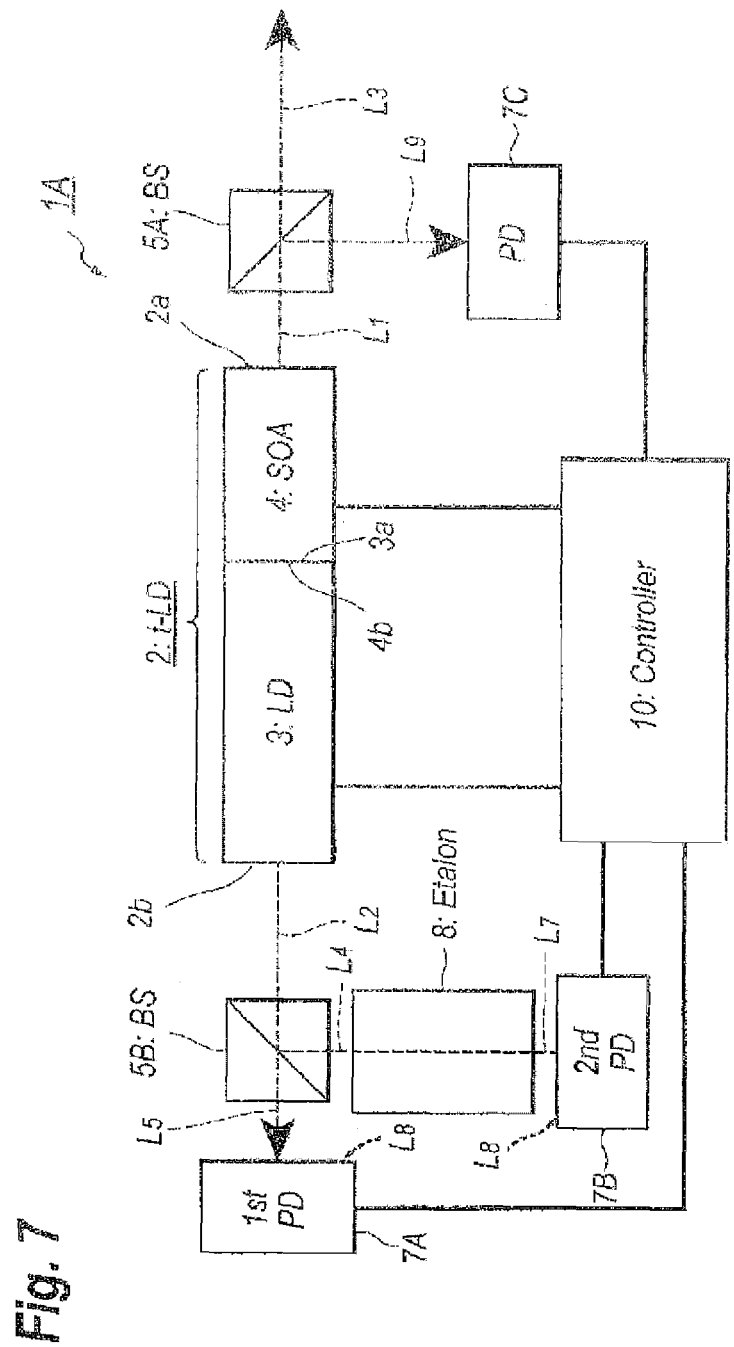
FIG. 7 is a functional block diagram of a laser apparatus according to the third embodiment.

The laser apparatus thus described disposes the wavelength monitor, or the wavelength locker, in the front side of the t-LD 2. However, a laser apparatus may set the wavelength monitor in the rear side of the t-LD 2. In such an arrangement, the wavelength monitor senses the rear light $L_2$ for evaluating the current emission wavelength. FIG. 7 is a schematic block diagram of at laser apparatus 1A having the arrangement of the rear monitor. The laser apparatus 1A provides the second BS 5B, etalon filter 8, and the first and second PDs, 7A and 7B, in the rear side of the t-LD 2 to sense the rear beam $L_2$. In the front side of the t-LD 2, the laser apparatus 1A provides the first BS 5A and the third PD 7C to monitor the magnitude of the front beam $L_1$.

In the rear monitor arrangement, the first and second PDs, 7A and 7B, are influenced by stray component $L_8$ originated to the front beam $L_1$ and the rear beam $L_2$. That is, a portion of the front beam $L_1$ may enter the first and second PDs, 7A and 7B, after being reflected several times within the laser module 50. Also, the rear beam $L_2$ enters the first and second PDs, 7A and 7B, through passes except for those of the raw beam $L_5$ and the filtered beam $L_7$, after being reflected several times within the laser module 50. However, the front beam $L_1$ has the magnitude far greater than that of the rear beam $L_2$; accordingly, the stray component originated to the rear beam $L_2$ may be ignorable.

In order to evaluate the magnitude of the stray component originated to the front beam $L_1$, the algorithm shown in FIG. 6C is applicable. That is, the procedure first sets the SOA 4 in the absorbing mode by supplying no bias current thereto, and fixes the biases and powers supplied to the LD 3. Under the bias condition for the LD 3 and the SOA 4, the front beam $L_1$ substantially vanish but only the rear beam $L_2$ is left, which is referred as the intrinsic rear beam. The magnitude of the raw beam $L_5$ and the filtered beam $L_7$ are detected, which will be called as the intrinsic magnitudes.

Then, setting the bias current supplied to the SOA 4 at an optional value where the SOA 4 is set in the amplifying mode. Under such a condition, a magnitude of the raw beam $L_5$ and a magnitude of the filtered beam $L_7$ are measured. Each of the magnitude of the raw beam $L_5$ and the magnitude of the filtered beam $L_7$ includes the magnitude of the stray component due to the front beam $L_1$, and the intrinsic rear beam $L_2$. Subtracting the intrinsic magnitude from the practically measured magnitudes, the magnitude of the stray component due to the front beam $L_1$ affected to the first and second PDs, 7A and 7B, can be determined as being a function of the bias current for the SOA 4. The memory 11 may store the relation of the stray components $L_8$ for the first and second PDs, 7A and 7B, against the bias current. In the practical operation of the laser apparatus 1, the bias current for the SOA 4 is optionally varied. However, the controller 10 may subtract the stray components $L_8$ stored in the memory 11 from the raw beam and the filtered beam. The calculated ratio may be enhanced in the accuracy thereof.

(Fourth Embodiment)

Figure 8:
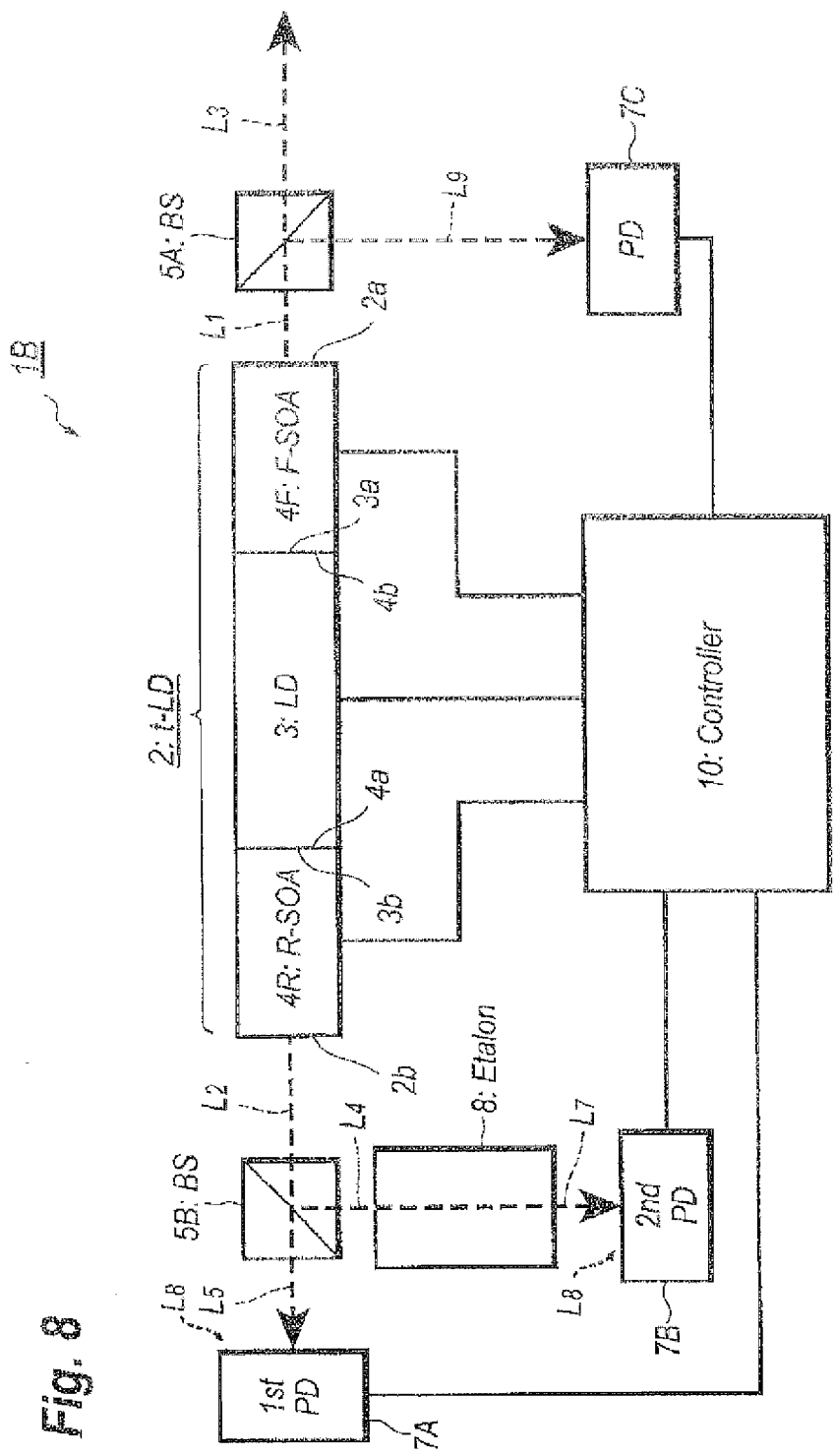
FIG. 8 is a functional block diagram of a laser apparatus according to the fourth embodiment.

FIG. 8 shows a block diagram of a laser apparatus 1B according to the fourth embodiment of the present application. The laser apparatus 1B has a feature distinguishable from the aforementioned laser apparatuses 1 and 1A, that the t-LD 2 provides two SOAs, namely, the front SOA 4F and the rear SOA 4R, continuous to respective facets, 3a and 3b, of the LD 3. The front SOA 4F operates as those of the SOA 4 to amplify an optical beam generated in the LD 3 and output in forward as the front beam $L_1$. On the other hand, the rear SOA 4R amplifies an optical beam output from the LD 3 rearward or the rear beam $L_2$ may substantially vanish. Although the block diagram of FIG. 8 does not explicitly illustrate, that the rear beam $L_2$ is guided outside of the laser apparatus 1B, the rear beam $L_2$ may be utilized as an output beam similar to the front beam $L_3$.

The first and second PDs, 7A and 7B, to determines the current emission wavelength of the t-LD 2 are influenced by the stray component $L_8$ originated from both of the front beam $L_1$ and the rear beam $L_2$, because the rear beam $L_2$ in the magnitude thereof becomes substantial different from the aforementioned embodiment. That is, the first and second PDs, 7A and 7B, may sense not only the raw beam $L_5$ and the filtered beam $L_7$, respectively, originated to the rear beam $L_2$, but the stray component $L_8$ originated to the frond beam $L_1$ and the rear beam $L_2$ after being randomly reflected several times within the laser module 50.

The estimation of the magnitude of the stray component originated to the front beam $L_1$ may be carried out as those similar to the third embodiment. That is, setting the rear SOA 4R in the absorbing mode, which means that in the third embodiment, the rear beam $L_2$ in the magnitude thereof becomes substantially vanish, and the sensed magnitude by the first and second PDs, 7A and 7B, directly reflects the magnitude of the stray component originated to the front beam $L_1$. On the other hand, the contribution of the rear beam $L_2$ to the stray component sensed by the first and second PDs, 7A and 7B, is necessary to isolate the first and second PDs, 7A and 7B, from the raw beam $L_5$ and the filtered beam $L_7$, respectively. For instance, setting optical absorbers in respective outputs of the second BS 5B and the etalon filter 8 so as not to sense the raw beam $L_5$ and the filtered beam $L_7$ by the first and second PDs, 7A and 7B, the stray component $L_8$ in the magnitude thereof may be estimated as a function of the magnitude of the rear beam $L_2$.

The ratio of the filtered beam $L_7$ to the raw beam $L_5$ in the magnitude thereof may be accurately calculated by subtracting the magnitude of the stray component due to the front beam $L_1$ at the bias current $I_{SOA-F}$ and that due to the rear beam $L_2$ at the bias current $I_{SOA-R}$ from respective magnitudes practically sensed by the first and second PDs, 7A and 7B. Thus, the current emission wavelength derived from the ratio thus calculated may be accurately determined. Because the set of the optical absorbers are practically unable to perform in the field after the shipment of the laser module 50, the estimation of the magnitude of the stray component due to the rear beam $L_2$, and also by the front beam $L_1$, is necessary to be performed during the delivery inspection and stored in the memory as the function of the bias currents to the front SOA 4F and the rear SOA 4R, respectively. In the field, the controller 10 may read the magnitude of the stray component $L_8$ corresponding to respective bias currents from the memory and enhance the accuracy of the current emission wavelength of the laser module 50.

Although the present invention has been Idly described in conjunction with the preferred embodiment thereof with reference to the accompanying drawing, it is to be understood that various changes and modifications may be apparent to those skilled in the art. Such changes and modifications are to be understood as included within the scope of the present invention as defined by the appended claims, unless they depart therefrom.

We claim:

1. A method to tune an emission wavelength of a laser apparatus that includes a wavelength tunable laser diode (t-LD) integrating a laser diode (LD) with a semiconductor optical amplifier (SOA), and a wavelength monitor to sense the emission wavelength of the t-LD, the wavelength monitor disposed in a front side of the t-LD, the wavelength monitor including an optical filter, a first photodiode (PD) to sense a raw beam not transmitting through the optical filter, and a second PD to sense a filtered beam split from the raw beam and transmitting through the optical filter, wherein the SOA is integrated with the front side of the t-LD, the method comprising steps of:
   evaluating a first stray component and a second stray component by the first PD and the second PD, respectively, the first stray component and the second stray component originating to an optical beam output from a rear side of the t-LD, the wavelength monitor not being disposed in the rear side of the t-LD;
   sensing the raw beam and the filtered beam by the first PD and the second PD, respectively; and
   calculating a ratio of the filtered beam subtracted with the second stray component to the raw beam subtracted with the first stray component,
   wherein the step of evaluating the first stray component and the second stray component includes steps of:
      activating the LD;
      providing a bias current to the SOA at at least two levels;
      sensing magnitudes of the raw beam by the first PD and magnitudes of the filtered beam by the second PD, respectively; and
      extrapolating a relation of the sensed magnitudes of the raw beam each corresponding to respective levels of the bias current for evaluating the first stray component when having no bias current, and a relation of the sensed magnitudes of the filtered beam each corresponding to respective levels of the bias current for evaluating the second stray component when having no bias current.

2. The method of claim 1, further comprising a step of adjusting biases supplied to the LD such that the ratio enters within a preset range around transmittance of the optical filter corresponding to a target wavelength.

* * * * *